(12) United States Patent
Mizuhashi et al.

(10) Patent No.: US 7,973,581 B2
(45) Date of Patent: Jul. 5, 2011

(54) PHASE DETECTOR, PHASE COMPARATOR, AND CLOCK SYNCHRONIZING DEVICE

(75) Inventors: Hiroshi Mizuhashi, Kanagawa (JP); Michiru Senda, Kanagawa (JP); Gen Koide, Shiga (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/379,019

(22) Filed: Feb. 11, 2009

(65) Prior Publication Data

US 2009/0219068 A1    Sep. 3, 2009

(30) Foreign Application Priority Data

Feb. 28, 2008  (JP) ................................ 2008-047157
Feb. 28, 2008  (JP) ................................ 2008-047158

(51) Int. Cl.
*H03K 3/356*   (2006.01)

(52) U.S. Cl. ....................................... 327/208; 327/218

(58) Field of Classification Search .................. 327/208, 327/218, 199, 200, 202–207, 209–213, 215; 326/93–98, 112, 119, 121
See application file for complete search history.

(56) References Cited

U.S. PATENT DOCUMENTS

2005/0242861 A1   11/2005  Kanda et al.

FOREIGN PATENT DOCUMENTS

| JP | 02-002719 | | 1/1990 |
|---|---|---|---|
| JP | 09-083358 | A | 3/1997 |
| JP | 09-223960 | A | 8/1997 |
| JP | 11-330924 | A | 11/1999 |
| JP | 2000-082944 | A | 3/2000 |
| JP | 2003-218692 | A | 7/2003 |
| JP | 2005-318479 | | 11/2005 |

OTHER PUBLICATIONS

Japanese Office Action issued Dec. 22, 2009 for corresponding Japanese Application No. 2008-047158.
Japanese Office Action issued Mar. 30, 2010 for corresponding Japanese Application No. 2008-047157.
Yuan, Jiren et al. "High-Speed CMOS Circuit Technique" IEEE Journal of Solid-State Circuits, vol. 24, No. 1, Feb. 1989.
Larsson, Patrik et al. "Impact of Clock Slope on True Single Phase Clocked (TSPC) CMOS Circuits," IEEE Journal of Solid-State Circuits, vol. 29, No. 6, Jun. 1994.

*Primary Examiner* — Lincoln Donovan
*Assistant Examiner* — Diana J Cheng
(74) *Attorney, Agent, or Firm* — Rader, Fishman & Grauer PLLC

(57) ABSTRACT

A flip-flop circuit includes: a first latch circuit that receives input of a data signal and a rise delay clock signal, raises a signal of a first node according to the fall of the rise delay clock signal, and lowers the signal of the first node according to the rise of the rise delay clock signal; a second latch circuit that receives input of the signal of the first node and the clock signal and lowers a signal of a second node at timing when the clock signal falls; a third latch circuit that receives input of the signal of the second node and the clock signal and generates an output signal for maintaining the data signal; and a pull-down circuit that pulls down the signal of the first node with the rise delay clock signal.

9 Claims, 10 Drawing Sheets

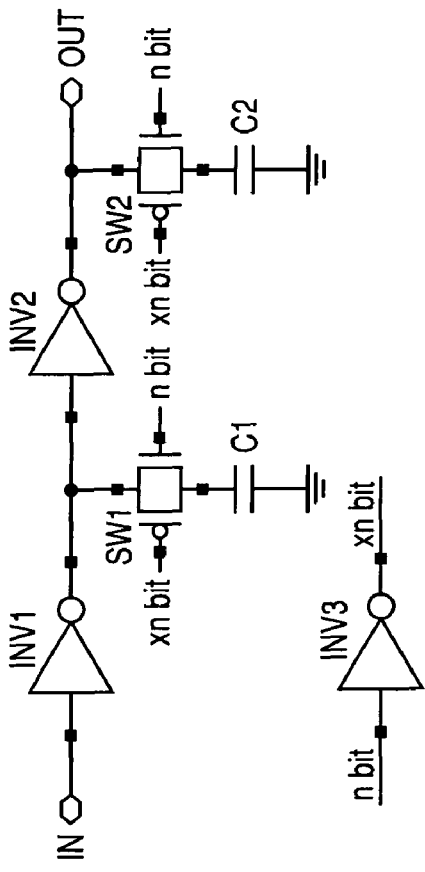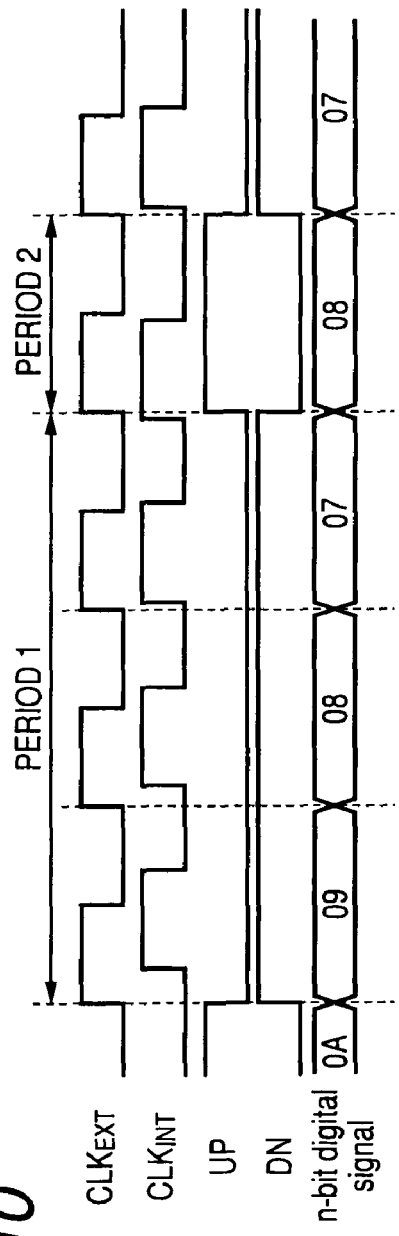
PRIOR ART
FIG. 9
PRIOR ART
FIG. 10

PRIOR ART *FIG. 13*
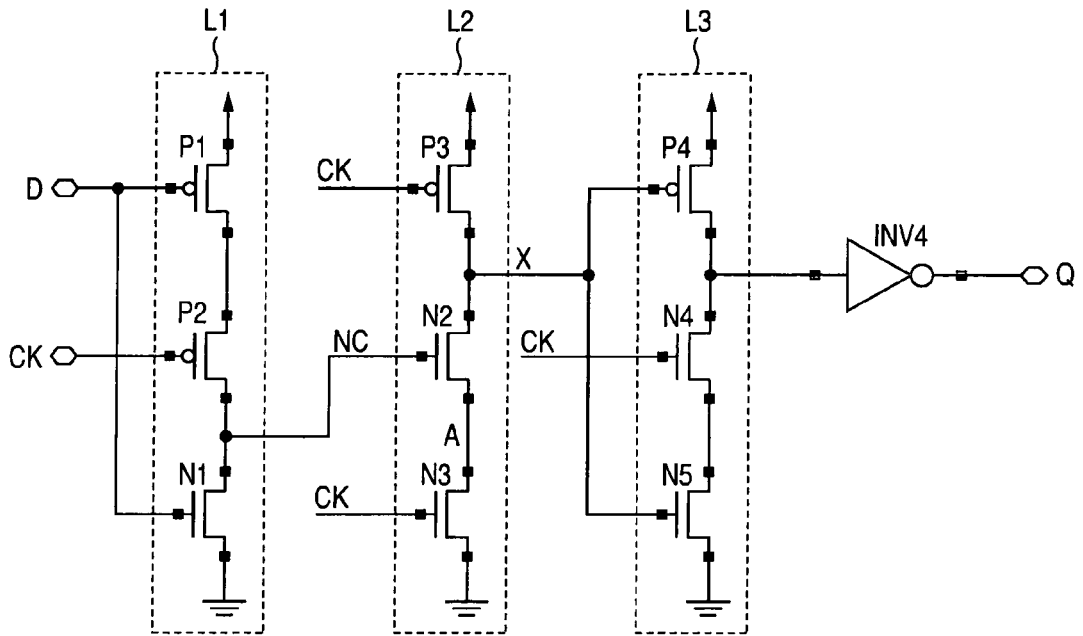
PRIOR ART *FIG. 14*
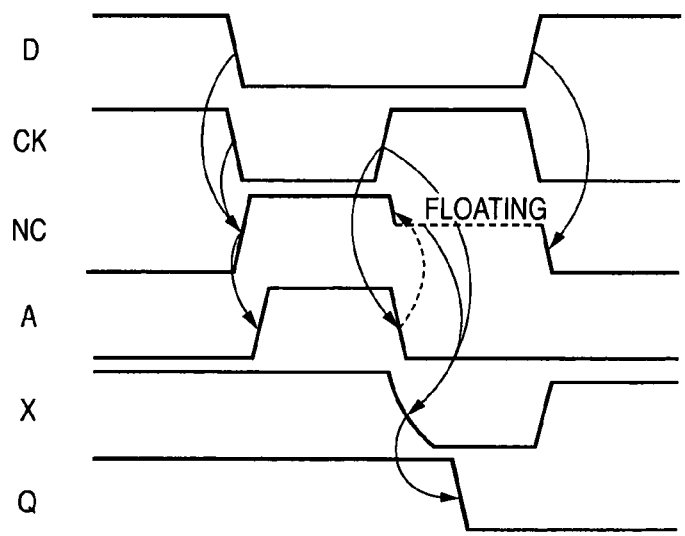

PRIOR ART FIG. 15
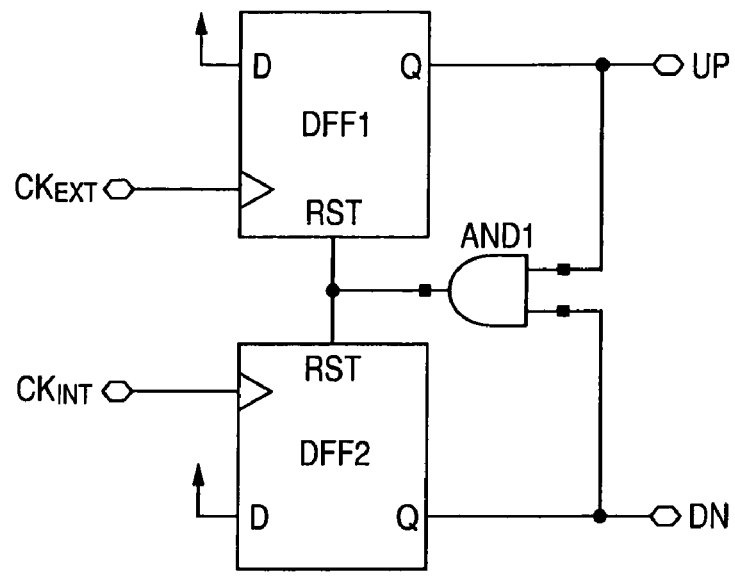
PRIOR ART FIG. 16
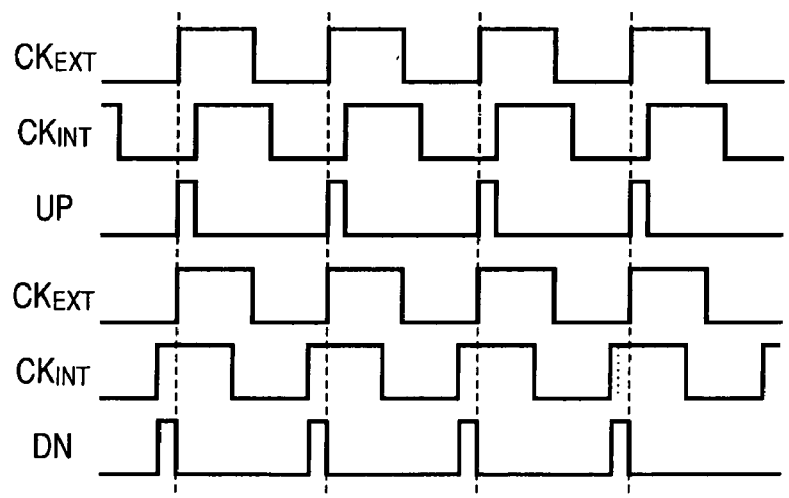

PHASE DETECTOR, PHASE COMPARATOR, AND CLOCK SYNCHRONIZING DEVICE

CROSS-REFERENCES TO RELATED APPLICATIONS

The present invention contains subject matter related to Japanese Patent Applications JP 2008-047157 and JP 2008-047158 both filed in the Japanese Patent Office on Feb. 28, 2008, the entire contents of which being incorporated herein by reference.

BACKGROUND OF THE INVENTION

1. Field of the Invention

The present invention relates to a phase detector that detects a shift of a phase of a comparison clock with respect to a phase of a reference clock, a phase comparator that detects phase delay and phase advance, and a clock synchronizing device that synchronizes the phases of both the clocks.

2. Description of the Related Art

A clock generator represented by a phase locked loop (hereinafter referred to as "PLL") and a delay locked loop (hereinafter referred to as "DLL") in a clock synchronizing system is an element circuit indispensable for keeping synchronization between external data (an external clock) and an internal clock. It is extremely important in constructing a stable clock synchronizing system to accurately adjust a phase relation between the external clock and the internal clock with the clock generator.

FIG. 8 is a block diagram of a configuration of a DLL in a digital system shown as an example of the clock generator. This DLL includes a phase comparator 1 that compares a phase difference between an external clock CLKEXT and an internal clock CLKINT, an up/down counter (hereinafter referred to as "counter") 2 that controls delay time according to output signals UP and DN from the phase comparator 1, and a delay line 3 and a clock driver 4 that perform adjustment of the delay time.

FIG. 9 is a circuit diagram of an example of a delay unit that configures a delay line. The delay unit includes inverters INV1, INV2, and INV3, switches SW1 and SW2, and capacitors C1 and C2. In this delay line, connection and disconnection of the capacitors C1 and C2 to and from the delay line are switched according to a level of an output signal n bit from the counter 2 shown in FIG. 8, whereby adjustment of a delay amount is realized.

FIG. 10 is a timing chart of the digital DLL. An operation principle of phase adjustment is explained with reference to this timing chart. When the internal clock CLKINT is delayed from the external clock CLKEXT (a period 1 shown in FIG. 10), the signal DN is at an "H" level, the counter 2 shown in FIG. 8 counts down, the capacitors for delay adjustment (the capacitors C1 and C2 shown in FIG. 9) are disconnected from the delay line one after the other, and the phase difference between the external clock CLKEXT and the internal clock CLKINT is narrowed.

Conversely, when the internal clock CLKINT overtakes the external clock CLKEXT (a period 2 shown in FIG. 10), the signal UP is at the "H" level, the counter 2 shown in FIG. 8 counts up, the capacitors for delay adjustment (the capacitors C1 and C2 shown in FIG. 9) are connected to the delay line one after the other, and the phase difference between the external clock CLKEXT and the internal clock CLKINT is narrowed.

With the configuration and the operations explained above, the phase difference between the external clock CLKEXT and the internal clock CLKINT is apparently brought closer to zero. Accuracy of bringing the phase difference closer to zero substantially depends upon the accuracy of the phase comparator 1. In other words, to design a highly accurate clock generator, it is necessary to design the phase comparator 1 that can highly accurately detect the phase difference between the external clock CLKEXT and the internal clock CLKINT.

FIG. 11 is a diagram for explaining a phase comparator in the past. FIG. 12 is a diagram for explaining input and output waveforms of the phase comparator in the past. As shown in FIG. 11, in the phase comparator in the past, a D type flip-flop (hereinafter referred to as "DFF") is used. The internal clock CLKINT is connected as a data signal D and the external clock CLKEXT is connected as a clock signal CK. The signal UP is connected to a positive phase output Q and the signal DN is connected to a negative phase output Qb.

As shown in FIG. 12, when the internal clock CLKINT is delayed from the external clock CLKEXT, the signal DN is at the "H" level. When the internal clock CLKINT is advanced from the external clock CLKEXT, the signal UP is at the "H" level. Therefore, it is seen that a function of the phase comparator is realized. In this configuration, narrowing of a dead zone of the DFF directly leads to an increase in accuracy of phase difference detection. Therefore, it is possible to improve accuracy of phase detection by using a dynamic DFF that responds at high speed and has a narrow dead zone.

FIG. 13 is a circuit diagram of an example of the dynamic DFF. This circuit is a true signal phase clock (hereinafter referred to as "TSPC") DFF. The dynamic DFF is actuated only with a positive phase clock to realize high speed and a narrow dead zone.

The DFF includes a first latch circuit L1 including a first p-channel transistor P1, a second p-channel transistor P2, and a first n-channel transistor N1, a second latch circuit L2 including a third p-channel transistor P3, a second n-channel transistor N2, and a third n-channel transistor N3, a third latch circuit L3 including a fourth p-channel transistor P4, a fourth n-channel transistor N4, and a fifth n-channel transistor N5, and an inverter INV 4.

A data signal D is connected to gates of the first p-channel transistor P1 and the first n-channel transistor N1. A clock signal CK is connected to gates of the second p-channel transistor P2, the third p-channel transistor P3, the third n-channel transistor N3, and the fourth n-channel transistor N4.

An output signal NC of the first latch circuit L1 is connected to a gate of the second n-channel transistor N2. An output signal X of the second latch circuit L2 is connected to gates of the fourth p-channel transistor P4 and the fifth n-channel transistor N5.

FIG. 14 is a timing chart in capturing an "L" level of the data signal D of the DFF. When the data signal D and the clock signal CK changes to the "L" level, an internal node NC changes to the "H" level. In response to this, the second n-channel transistor N2 is turned on and an internal node A also changes to the "H" level.

When the clock signal CK changes to the "H" level, the internal node NC changes to a floating state. Since the third n-channel transistor N3 is turned on at this timing, the internal node A changes to the "L" level. The level of the internal node NC in the floating state falls being affected by coupling due to a gate capacity of the second n-channel transistor N2. Therefore, mutual conductance gm of the second n-channel transistor N2 falls, a signal change in an internal node X slows down, and a delay occurs between rising timing of the clock signal CK and an "L" output.

A difference between time until the internal node NC changes to the "L" level in response to the rise of the data signal D and the second n-channel transistor N2 is turned off and time from the rise of the clock signal CK until the internal node X changes to the "L" level is considered to be a margin of data hold time. Therefore, the margin of the data hold time is spoiled by the fall of the internal node NC to an intermediate level in response to the rise of the clock signal CK. In other words, the performance of the high speed and the narrow dead zone is spoiled by the presence of a floating node in the inside.

As an example of improvement of the TSPC-DFF, in the past, there is disclosed a technique for connecting an n-channel transistor for pull-down to the internal node NC and controlling a gate level thereof with a signal obtained by delaying the clock signal CK (see, JP-A-2005-318479).

As shown in FIG. 11, when the phase comparator is simply realized by one DFF, if dead zone width of the DFF decreases to be shorter than delay time controllable by the delay unit shown in FIG. 9, the DFF repeats count-up and count-down and a phase is not locked. Therefore, it is difficult to narrow the dead zone width of the DFF itself more than necessary. From such a viewpoint, a phase comparator shown in FIG. 15 is also used. In this phase comparator, a period in which UP (or DOWN) is "H" corresponds to a phase difference. When both UP and DOWN rise, a flip-flop is reset and both UP and DOWN fall (see FIG. 16).

SUMMARY OF THE INVENTION

However, even if the technique disclosed in JP-A-2005-318479 is used, after all, the internal node NC is in the floating state during time in which the clock signal CK is delayed. Therefore, the problem in that the performance of the high speed and the narrow dead zone is spoiled is not solved.

In the flip-flop circuit disclosed in JP-A-2005-318479, although a delay clock is input to the sixth n-channel transistor N6, a normal clock (a clock not delayed) is input to the second p-channel transistor P2. Therefore, a node N1 remains floating after the clock changes from the "L" level to the "H" level until the delay clock changes from the "L" level to the "H" level.

It is conceivable to input the delay clock to the second p-channel transistor P2 as well. However, in this case, pre-charge time of the node N1 decreases when the normal clock changes from the "H" level to the "L" level. Therefore, it is likely that, when the node N1 is actuated at a higher frequency, pre-charge becomes insufficient to cause malfunction.

This phase comparator is widely used in DLLs of an analog type. When the phase comparator is applied to the digital DLL, it is also necessary to narrow a dead zone of a counter as a next-stage circuit that captures an UP (or DOWN) pulse. When both UP and DOWN rise, the flip-flop is reset and both UP and DOWN fall. However, actually, since finite time is necessary until the flip-flop is reset, there is a period in which both the outputs transiently rise. Therefore, the counter as the next-stage circuit cause malfunction.

Therefore, it is desirable to provide a flip-flop circuit that has a narrow dead zone, can operate at high sped, and is suitable for a phase comparator that can stably operate.

It is also desirable to provide, as a phase comparator used in a clock synchronizing system, a phase comparator that can surely lock a phase when clocks are synchronized without affecting a counter at a next stage.

According to an embodiment of the present invention, there is provided a flip-flop circuit including: a first latch circuit that receives input of a data signal and a rise delay clock signal obtained by delaying only the rise of a clock signal, raises a signal of a first node according to the fall of the rise delay clock signal in a state in which the data signal falls, and lowers the signal of the first node according to the rise of the rise delay clock signal; a second latch circuit that receives input of the signal of the first node and the clock signal and lowers a signal of a second node at timing when the clock signal falls in a state in which the signal of the first node rises; a third latch circuit that receives input of the signal of the second node and the clock signal and generates an output signal for maintaining the data signal in a state in which the clock signal rises; and a pull-down circuit that pulls down the signal of the first node with the rise delay clock signal.

According to the embodiment, since the pull-down circuit is provided in the first node, it is possible to suppress occurrence of a floating period of the first node. Further, since a signal for delaying only the rise is given to the pull-down circuit and the first latch circuit, the fall is not delayed and it is possible to suppress a loss of pre-charge time of the first node.

The flip-flop circuit is a flip-flop circuit in which a clocked inverter circuit is connected to the second node. This makes it possible to prevent floating of the second node.

The first latch circuit includes a first p-channel transistor, a second p-channel transistor, and a first n-channel transistor connected in series. The data signal is input to gates of the first p-channel transistor and the first n-channel transistor. The rise delay clock signal is input to a gate of the second p-channel transistor.

The second latch circuit includes a third p-channel transistor, a second n-channel transistor, and a third n-channel transistor connected in series. The clock signal is input to gates of the third p-channel transistor and the third n-channel transistor. The signal of the first node is input to a gate of the second n-channel transistor gate.

The third latch circuit includes a fourth p-channel transistor, a fourth n-channel transistor, and a fifth n-channel transistor connected in series. The signal of the second node is input to gates of the fourth p-channel transistor and the fifth n-channel transistor. The clock signal is input to a gate of the fourth n-channel transistor.

The pull-down circuit includes a sixth n-channel transistor. The rise delay clock signal is input to a gate of the sixth n-channel transistor. The first node is connected to a source of the sixth n-channel transistor.

The clocked inverter circuit includes a fifth p-channel transistor, a sixth p-channel transistor, a seventh n-channel transistor, and an eighth n-channel transistor connected in series. The first node signal is input to a gate of the fifth p-channel transistor. The signal of the second node is input to gates of the sixth p-channel transistor and the seventh n-channel transistor via an inverter. The clock signal is input to a gate of the eighth n-channel transistor.

According to another embodiment of the present invention, there is provided a phase detector including: a first phase comparing unit that detects a shift of a phase of a comparison clock with respect to a phase of a reference clock; a second phase comparing unit that detects, concerning one of the reference clock and the comparison clock, a shift of phases of both the clocks in a state of delay or advance by a predetermined time; and an AND unit that outputs, as a result of the detection of the phase shift, an AND of an output of the first phase comparing unit and an output of the second phase comparing unit.

According to the embodiment, a detection result of a shift of phases in the second phase comparing unit is a detection result in the state of delay or advance by the predetermined time with respect to a detection result of the shift of the phases in the first phase comparing unit. Therefore, an output from the AND unit changes to an "L" level at a stage when the shift of the phases changes from delay to advance or from advance to delay. The detection result of the phase shift can be fixed.

According to still another embodiment of the present invention, there is provided a phase comparator including: a delay-phase detecting unit that detects a delay of a phase of a comparison clock with respect to a phase of a reference clock; and an advance-phase detecting unit that detects advance of the phase of the comparison clock with respect to the phase of the reference clock. The delay-phase detecting unit includes: a first phase comparing unit that detects the delay of the phase of the comparison clock with respect to the phase of the reference clock; a second phase comparing unit that detects, concerning one of the reference clock and the comparison clock, a delay of a phase of the comparison clock with respect to a phase of the reference clock in a state of delay or advance by a predetermined time; and a first AND unit that outputs, as a result of the detection of the phase delay, an AND of an output of the first phase comparing unit and an output of the second phase comparing unit. The advance-phase detecting unit includes: a third phase comparing unit that detects advance of the phase of the comparison clock with respect to the phase of the reference clock; a fourth phase comparing unit that detects, concerning one of the reference clock and the comparison clock, advance of the phase of the comparison clock with respect to the phase of the reference clock in the state of delay or advance by the predetermined time; and a second AND unit that outputs, as a result of the detection of the phase advance, an AND of an output of the third phase comparing unit and an output of the fourth phase comparing unit.

According to the embodiment, when the delay-phase detecting unit and the advance-phase detecting unit detect delay or advance of a phase, in the delay-phase detecting unit, a detection result of delay of a phase in the second phase comparing unit is a detection result in the state of delay or advance by the predetermined time with respect to a detection result of the delay of the phase in the first phase comparing unit. In the advance-phase detecting unit, a detection result of advance of a phase in the fourth phase comparing unit is a detection result in the state of delay or advance by the predetermined time with respect to a detection result of the advance of the phase in the third phase comparing unit. Therefore, an output from the first AND unit or an output from the second AND unit changes to the "L" level at a stage when the shift of the phases changes from delay to advance or from advance to delay. The detection result of the phase shift can be fixed.

According to still another embodiment of the present invention, there is provided a phase comparator including: a first phase comparing unit that detects a shift of a phase of the comparison clock with respect to a phase of a reference clock and outputs signals in opposite phases in phase delay and phase advance; a second phase comparing unit that detects, concerning one of the reference clock and the comparison clock, delay of a phase of the comparison clock with respect to a phase of the reference clock in a state of delay or advance by a predetermined time; a third phase comparing unit that detects, concerning one of the reference clock and the comparison clock, advance of the phase of the comparison clock with respect to the phase of the reference clock in the state of delay or advance by the predetermined time; a first AND unit that outputs, as a result of the detection of the phase delay, an AND of an output of phase delay of the first phase comparing unit and an output of the second phase comparing unit; and a second AND unit that outputs, as a result of the detection of the phase advance, an AND of an output of phase advance of the first phase comparing unit and an output of the third phase comparing unit.

According to the embodiment, when the phase comparator detects delay or advance of a phase, a detection result of delay of a phase in the second phase comparing unit is a detection result in the state of delay or advance by the predetermined time with respect to a detection result of the delay of the phase in the first phase comparing unit. A detection result of advance of a phase in the third phase comparing unit is a detection result in the state of delay or advance by the predetermined time with respect to a detection result of the advance of the phase in the first phase comparing unit. Therefore, an output from the first AND unit or an output from the second AND unit changes to the "L" level at a stage when the shift of the phases changes from delay to advance or from advance to delay. The detection result of the phase shift can be fixed.

According to still another embodiment of the present invention, there is provided a clock synchronizing device that synchronizes a phase of a reference clock and a phase of a comparison clock, the clock synchronizing device including: a phase comparator that detects delay and advance of the phase of the comparison clock with respect to the phase of the reference clock; an up/down counter that outputs a count value on the basis of a detection result from the phase comparator; and a delay line that adjusts an intervention amount of plural delay elements on the basis of the count value output from the up/down counter and adjusts a delay amount of delay elements of the comparison clock. The phase comparator includes a delay-phase detecting unit including: a first phase comparison unit that detects delay of the phase of the comparison clock with respect to the phase of the reference clock; a second phase comparison unit that detects, concerning one of the reference clock and the comparison clock, a delay of a phase of the comparison clock with respect to a phase of the reference clock in a state of delay or advance by a minimum delay time; and a first AND unit that outputs, as a result of the detection of the phase delay, an AND of an output of the first phase comparing unit and an output of the second phase comparing unit and an advance-phase detecting unit including: a third phase comparing unit that detects advance of the phase of the comparison clock with respect to the phase of the reference clock; a fourth phase comparing unit that detects, concerning one of the reference clock and the comparison clock, advance of the phase of the comparison clock with respect to the phase of the reference clock in the state of delay or advance by the minimum delay time; and a second AND unit that outputs, as a result of the detection of the phase advance, an AND of an output of the third phase comparing unit and an output of the fourth phase comparing unit.

According to the embodiment, when the clock synchronizing device synchronizes the reference clock and the comparison clock, in the delay-phase detecting unit, a detection result of delay of a phase in the second phase comparing unit is a detection result in the state of delay or advance by the minimum delay time with respect to a detection result of the delay of the phase in the first phase comparing unit. In the advance-phase detecting unit, a detection result of advance of a phase in the fourth phase comparing unit is a detection result in the state of delay or advance by the minimum delay time with respect to a detection result of the advance of the phase in the third phase comparing unit. Therefore, an output from the first AND unit or an output from the second AND unit changes to the "L" level at a stage when the shift of the phases changes from delay to advance or from advance to delay. The phase shift can be fixed in a state within the minimum delay time of the delay elements.

According to still another embodiment of the present invention, there is provided a clock synchronizing device that synchronizes a phase of a reference clock and a phase of a comparison clock, the clock synchronizing device including: a phase comparator that detects delay and advance of the phase of the comparison clock with respect to the phase of the reference clock; an up/down counter that outputs a count value on the basis of a detection result from the phase comparator; and a delay line that adjusts an intervention amount of plural delay elements on the basis of the count value output from the up/down counter and adjusts a delay amount of delay elements of the comparison clock. The phase comparator includes: a first phase comparing unit that detects a shift of the phase of the comparison clock with respect to the phase of the reference clock and outputs signals in opposite phases in phase delay and phase advance; a second phase comparing unit that detects, concerning one of the reference clock and the comparison clock, delay of a phase of the comparison clock with respect to a phase of the reference clock in a state of delay or advance by a minimum delay time; a third phase comparing unit that detects, concerning one of the reference clock and the comparison clock, advance of the phase of the comparison clock with respect to the phase of the reference clock in the state of delay or advance by the minimum delay time; a first AND unit that outputs, as a result of the detection of the phase delay, an AND of an output of phase delay of the first phase comparing unit and an output of the second phase comparing unit; and a second AND unit that outputs, as a result of the detection of the phase advance, an AND of an output of phase advance of the first phase comparing unit and an output of the third phase comparing unit.

According to the embodiment, when the clock synchronizing device synchronizes the reference clock and the comparison clock, a detection result of delay of a phase in the second phase comparing unit is a detection result in the state of delay or advance by the minimum delay time with respect to a detection result of the delay of the phase in the first phase comparing unit. A detection result of advance of a phase in the third phase comparing unit is a detection result in the state of delay or advance by the minimum delay time with respect to a detection result of the advance of the phase in the first phase comparing unit. Therefore, an output from the first AND unit or an output from the second AND unit changes to the "L" level at a stage when the shift of the phases changes from delay to advance or from advance to delay. The phase shift can be fixed in a state within the minimum delay time of the delay elements.

According to the embodiments, a dead zone is narrow and a high-speed operation is possible in the flip-flop circuit. It is possible to configure a phase comparator that can stably operate.

According to the embodiments, it is possible to provide, as the phase comparator used for the clock synchronizing system, a phase comparator that can surely lock a phase when clocks are synchronized without affecting a counter at the next stage.

BRIEF DESCRIPTION OF THE DRAWINGS

FIG. 9 is a circuit diagram of an example of a delay unit that configures a delay line;

FIG. 10 is a timing chart of the digital DLL;

FIG. 13 is a circuit diagram of an example of a dynamic DFF;

FIG. 14 is a timing chart in capturing an "L" level of a data signal D of a DFF;

FIG. 15 is a diagram for explaining another example of the phase comparator in the past; and FIG. 16 is a diagram of input and output waveforms of the other example of the phase comparator in the past.

DESCRIPTION OF THE PREFERRED EMBODIMENTS

An embodiment of the present invention is explained below with reference to the accompanying drawings.
Flip-Flop Circuit In a phase detector and a phase comparator according to this embodiment, it is possible to detect delay and advance of a phase, suppress a resonant operation in which delay and advance are alternately repeated, and surely lock the phase. Therefore, it is possible to apply a flip-flop circuit that can operate at high speed and has a narrow dead zone. A flip-flop circuit suitably used in the phase detector and the phase comparator according to this embodiment is explained below.

Figure 8:
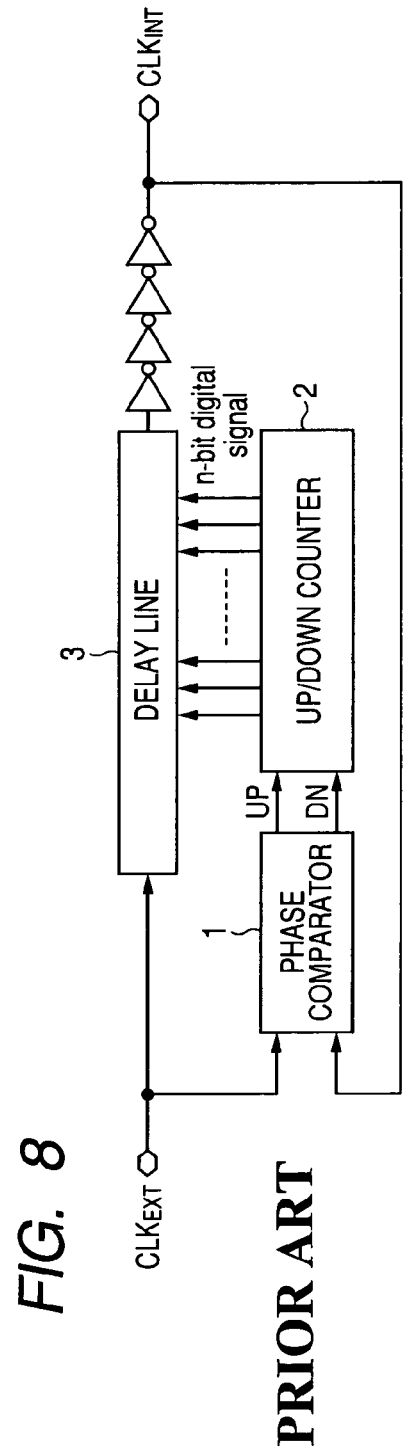
FIG. 8 is a block diagram of a configuration of a DLL in a digital system as an example of a clock generator.

The flip-flop circuit according to this embodiment is applied as, for example, a phase comparator 1 in a DLL of a digital system shown in FIG. 8. The DLL includes the phase comparator 1 that compares a phase difference between an external clock CLKEXT and an internal clock CLKINT, a counter 22 that controls delay time with output signals UP and DN from the phase comparator 1, and the delay line 3 and the clock driver 4 that perform adjustment of the delay time.

The delay line includes a delay unit including inverters INV1, INV2, and INV3, switches SW1 and SW2, and capacitors C1 and C2 shown in FIG. 9. Adjustment of a delay amount is realized by switching connection and disconnection of the capacitors C1 and C2 to and from the delay line according to a level of an output signal n bit from the counter 2 shown in FIG. 8.

In the DLL, when the internal clock CLKINT is delayed from the external clock CLKEXT, the signal DN is at an "H" level, the counter 2 counts down, the capacitors for delay adjustment (the capacitors C1 and C2 shown in FIG. 9) are disconnected from the delay line one after the other, and the phase difference between the external clock CLKEXT and the internal clock CLKINT is narrowed.

Conversely, when the internal clock CLKINT overtakes the external clock CLKEXT, the signal UP is at the "H" level, the counter 2 counts up, the capacitors for delay adjustment (the capacitors C1 and C2 shown in FIG. 9) are connected to the delay line one after the other, and the phase difference between the external clock CLKEXT and the internal clock CLKINT is narrowed.

Figure 11:
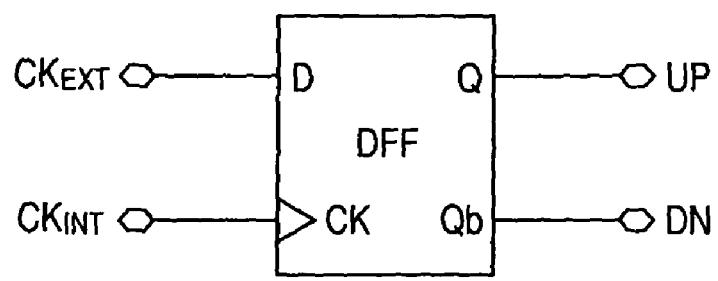
FIG. 11 is a diagram for explaining a phase comparator in the past.
Figure 12:
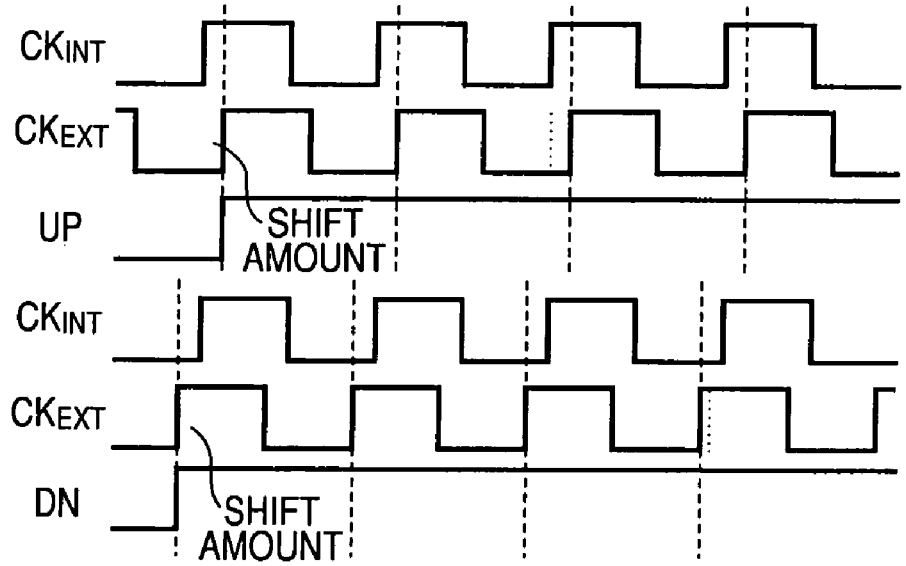
FIG. 12 is a diagram for explaining input and output waveforms of the phase comparator in the past.

As shown in FIG. 11, when the phase comparator used for the DLL is configured by a DFF, the internal clock CLKINT is connected to a data input unit (a data signal D) and the external clock CLKEXT is connected to a clock input unit. The signal UP is connected to a positive phase output Q and the signal DN is connected to a negative phase output Qb. The flip-flop circuit according to this embodiment is used in the phase comparator of such a DLL and has a configuration explained below.

Figure 4:
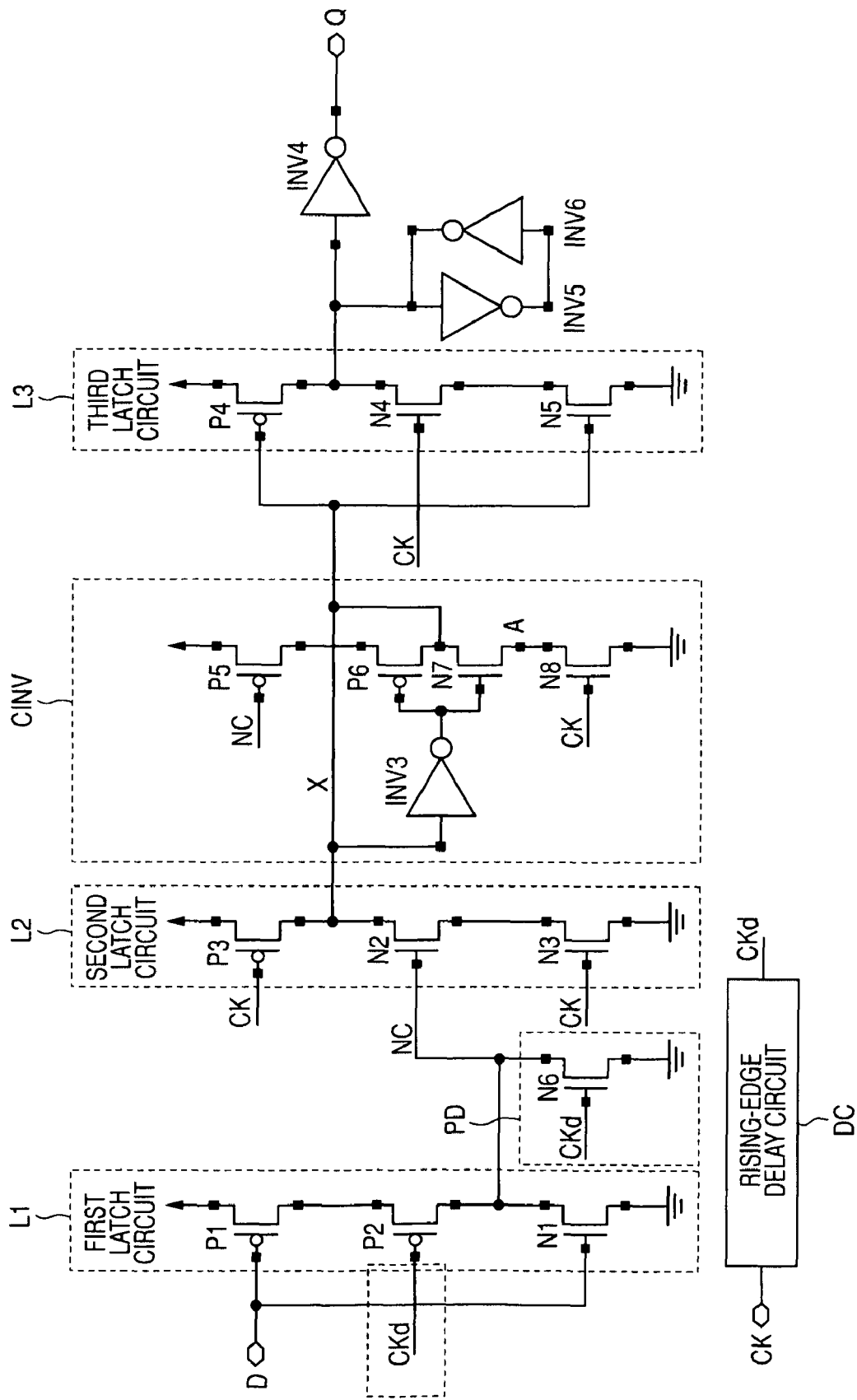
FIG. 4 is a circuit diagram for explaining a flip-flop circuit suitably used in the phase detector and the phase comparator according to the embodiment.

FIG. 4 is a circuit diagram for explaining the flip-flop circuit suitably used in the phase detector and the phase comparator according to this embodiment. This flip-flop circuit is mainly a TSPC-type DFF. The flip-flop circuit according to this embodiment includes a first latch circuit L1 that receives input of a data signal D and a rise delay clock signal CKd obtained by delaying only the rise of a clock signal CK, raises a signal of an internal node NC as a first node according to the fall of the rise delay clock signal CKd in a state in which the data signal D falls, and lowers the signal of the internal node NC according to the rise of the rise delay clock signal CKd, a second latch circuit L2 that receives input of the signal of the internal node NC and the clock signal CK and lowers a signal of an internal node X as a second node at timing when the clock signal CK falls in a state in which the signal of the internal node NC rises, a third latch circuit L3 that receives input of the signal of the internal node X and the clock signal CK and generates an output signal Q for maintaining the data signal D in a state in which the clock signal CK rises, and a pull-down circuit PD that pulls down the signal of the internal node NC with the rise delay clock signal CKd.

Figure 5:
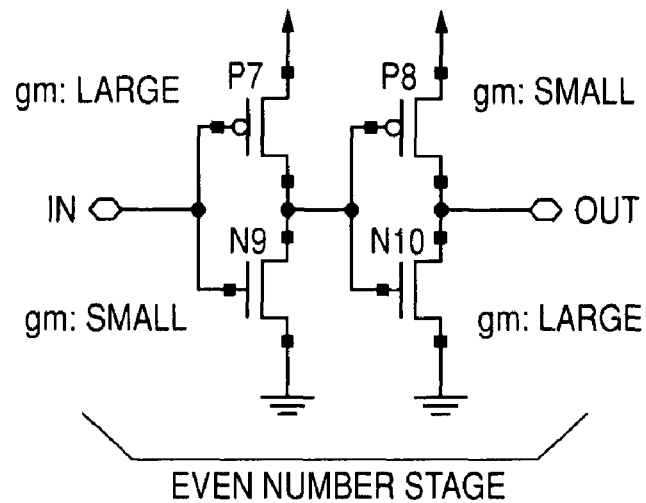
FIG. 5 is a circuit diagram of an example of a rise delay circuit.

The rise delay clock signal CKd is generated by a rise delay circuit DC. FIG. 5 is a circuit diagram of an example of a rise delay circuit. At an input stage, mutual conductance gm of a p-channel transistor P7 is set large and mutual conductance gm of an n-channel transistor N9 is set small. At the next stage, the mutual conductance is set oppositely. In this way, propagation delay at a rising edge of an input signal (a clock signal) is set large and propagation delay of a falling edge of the input signal is set small.

In the flip-flop circuit according to this embodiment, in the first latch circuit L1, a first p-channel transistor P1, a second p-channel transistor P2, and a first n-channel transistor N1 are connected in series. The data signal D is input to gates of the first p-channel transistor P1 ad the first n-channel transistor N1. The rise delay clock signal CKd is input to a gate of the second p-channel transistor P2.

In the second latch circuit L2, a third p-channel transistor P3, a second n-channel transistor N2, and a third n-channel transistor N3 are connected in series. The clock signal CK is input to gates of the third p-channel transistor P3 and the third n-channel transistor N3. The signal of the internal node NC is input to a gate of the second n-channel transistor N2.

In the third latch circuit L3, a fourth p-channel transistor P4, a fourth n-channel transistor N4, and a fifth n-channel transistor N5 are connected in series. The signal of the internal node X is input to gates of the fourth p-channel transistor P4 and the fifth n-channel transistor N5. The clock signal CK is input to a gate of the fourth n-channel transistor N4.

The pull-down circuit PD includes a sixth n-channel transistor N6. The rise delay clock signal CKd is input to a gate of the sixth n-channel transistor N6. The internal node NC is connected to a source of the sixth n-channel transistor N6.

Since the pull-down circuit PD is connected to the internal node NC, it is possible to prevent the internal node NC from floating during an operation. In other words, the internal node NC is prevented from changing to a floating level during an operation period by adding the sixth n-channel transistor N6 for pull-down to the internal node NC and controlling, with the rise delay clock signal CKd, a gate potential of the sixth n-channel transistor N6 and a gate potential of the second p-channel transistor P2 forming the latch circuit L1.

In this embodiment, a clocked inverter circuit CINV is connected to the internal node X. The clock signal CK and the signal of the internal node NC are input to the clocked inverter circuit CINV. Floating of the internal node X is prevented by the signal of the internal node NC at the rise of the clock signal CK.

Specifically, in the clocked inverter circuit CINV, a fifth p-channel transistor P5, a sixth p-channel transistor P6, a seventh n-channel transistor N7, and an eighth n-channel transistor N8 are connected in series. The signal of the internal node NC is input to a gate of the fifth p-channel transistor P5. The signal of the internal node X is input to gates of the sixth p-channel transistor P6 and the seventh n-channel transistor N7 via the inverter INV 3. The clock signal CK is input to a gate of the eighth n-channel transistor N8.

The clocked inverter circuit CINV performs control of a gate potential of the fifth p-channel transistor P5 with the internal node NC rather than the clock signal CK to thereby prevent the internal node NC from floating during an operation period without disturbing a signal change of the internal node X.

The specific circuit configuration explained above is only an example. The flip-flop circuit is not limited to the circuit as long as the flip-flop circuit performs the same operations.

Figure 6:
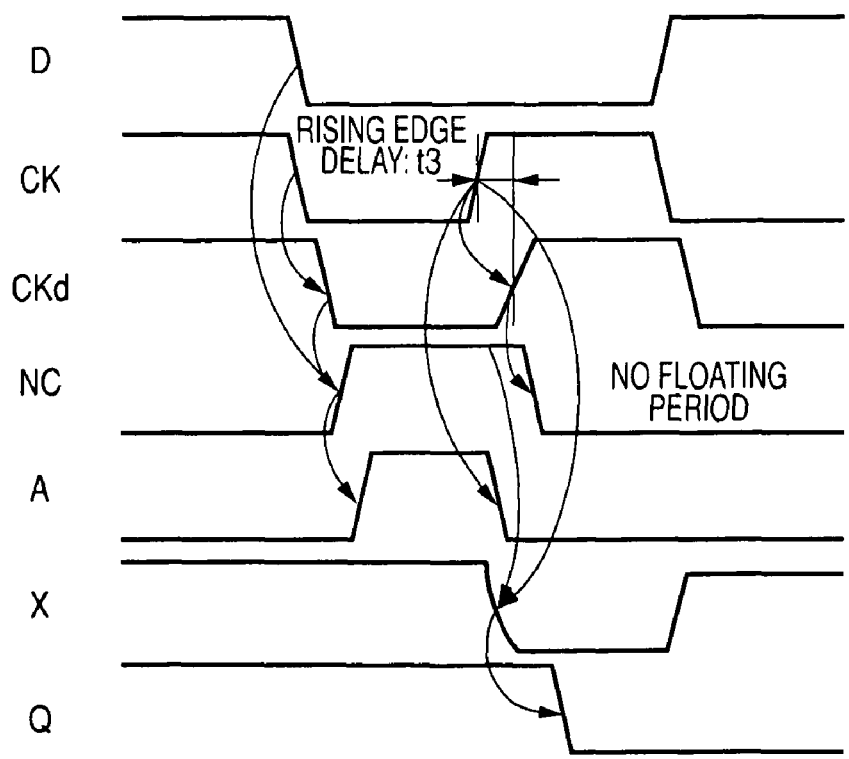
FIG. 6 is a timing chart for explaining an operation principle of the flip-flop circuit.

An operation principle of the flip-flop circuit is explained. FIG. 6 is a timing chart for explaining an operation principle of the flip-flop circuit. First, when the data signal D and the clock signal CK change to an "L" level, the rise delay clock signal CKd also changes to the "L" level through the rise delay circuit DC. The internal node NC changes to an "H" level. At this point, since propagation delay at the fall is suppressed as much as possible by the rise delay circuit DC, it is possible to suppress a loss of pre-charge time of the internal node NC.

In response to the "H" level of the internal node NC, the second n-channel transistor N2 is turned on and an internal node A also changes to the "H" level.

Subsequently, when the clock signal CK changes to the "H" level, the internal node A changes to the "L" level and the internal node X also changes to the "L" level. At this point, the internal node NC is pulled down by the sixth n-channel transistor N6 controlled by the rise delay clock signal CKd and is fixed to the "H" level (not floating). Consequently, a change of the internal node X is performed at high speed.

After time t3 elapses, the rise delay clock signal CKd changes to the "H" level and the sixth n-channel transistor N6 is turned off. The delay time t3 is set to time necessary for the internal node X to change and the inverter INV 3 to respond.

At the same time, the fifth p-channel transistor P5 is turned on. Therefore, the internal node X maintains that state.

As explained above, in the flip-flop circuit according to this embodiment, a node that floats during an operation period is not present. Therefore, it is possible to perform a stable operation without spoiling characteristics of the TSPC-DFF such as the high speed and the narrow dead zone.

Phase Detector

Figure 1:
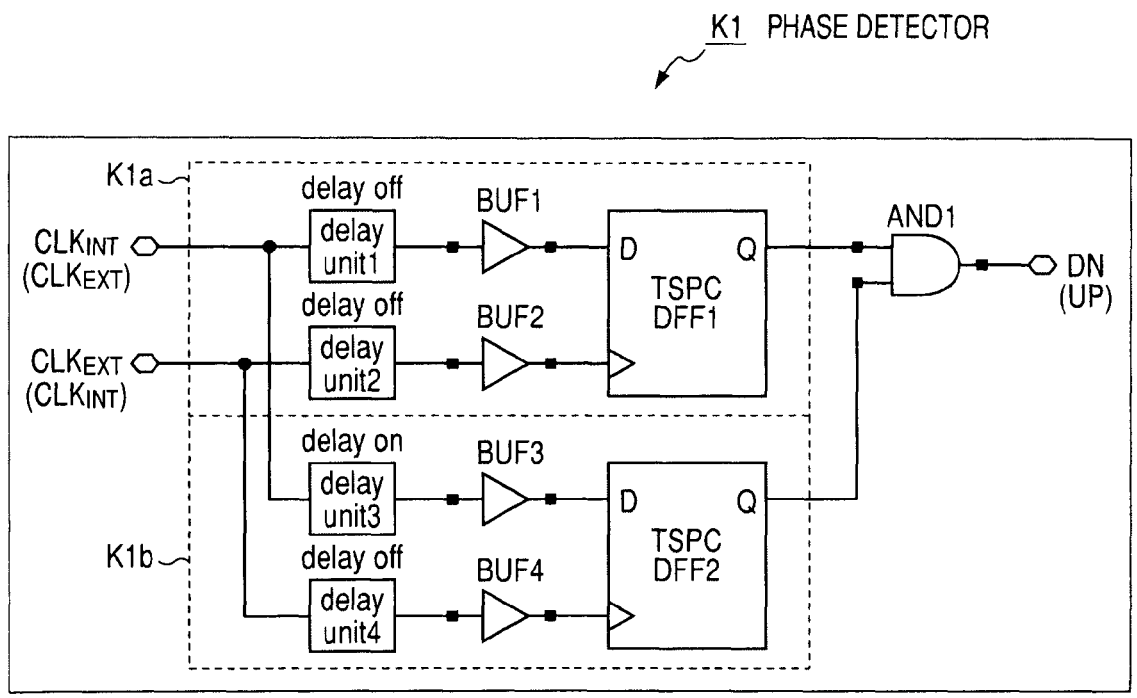
FIG. 1 is a circuit diagram for explaining a phase detector according to an embodiment of the present invention.

FIG. 1 is a circuit diagram for explaining the phase detector according to this embodiment. This phase detector K1 includes a first phase comparing unit K1a that detects a shift of a phase of a comparison clock with respect to a phase of a reference clock, a second phase comparing unit K1b that detects, concerning one of the reference clock and the comparison clock, a shift of phases of both the clocks in a state of delay of a predetermined time, and an AND unit AND1 that outputs, as a result of the detection of the phase shift, an AND of an output of the first phase comparing unit K1a and an output of the second phase comparing unit K1b.

In the phase detector K1 shown in FIG. 1, one of the internal clock CLKINT and the external clock CLKEXT is used as the reference clock and the other is used as the comparison clock. Specifically, a clock input as a clock signal CK of TSPCDFF 1 and TSPCDFF 2 as flip-flop circuits explained later is the reference clock and a clock input as a data signal D is the comparison clock.

The first phase comparing unit K1a includes a TSPCDFF 1 as a TSPC-type DFF. Further, the first phase comparing unit K1a includes buffers BUF1 and BUF2 and delay units 1 and 2 like the delay unit shown in FIG. 8. The buffer BUF1 and the delay unit 1 are connected to a line for a data signal D of the TSPCDFF 1 to which the comparison clock is input. The buffer BUF2 and the delay unit 2 are connected to a line for the clock signal CK of the TSPCDFF 1 to which the reference clock is input.

The second phase comparing unit K1b includes a TSPCDFF 2 as a TSPC-type DFF. Further, the second phase comparing unit K1b includes buffers BUF3 and BUF4 and delay units 3 and 4 like the delay unit shown in FIG. 8. The buffer BUF3 and the delay unit 3 are connected to a line for the data signal D of the TSPCDFF 2 to which the comparison clock is input. The buffer BUF4 and the delay unit 4 are connected to a line for the clock signal CK of the TSPCDFF 2 to which the reference clock is input.

As explained above, the first phase comparing unit K1a and the second phase comparing unit K1b have the same configuration. However, the first phase comparing unit K1a and the second phase comparing unit K1b are different in that, while both the delay units 1 and 2 of the first phase comparing unit K1a are delay off, the delay unit 3 of the second phase comparing unit K1b is delay on and the delay unit 4 is delay off.

Therefore, the first phase comparing unit K1a can obtain a result at the present point as a detection result of a shift of phases of the reference clock and the comparison clock. The second phase comparing unit K1b can obtain, as a detection result of the shift of the phases, a result in a state of delay by a delay time (a minimum delay time) equivalent to one delay unit. These detection results are input to the AND unit AND1.

Consequently, when both the first phase comparing unit K1a and the second phase comparing unit K1b detect delay or advance of the phases of the reference clock and the comparison clock, a signal of the "H" level indicating that delay or advance of the phases is detected is output from the AND unit AND1. When the first phase comparing unit K1a and the second phase comparing unit K1b do no detect delay or advance of the phases, a signal of the "L" level indicating that delay or advance of the phases is not detected is output from the AND unit AND1.

The detection results of the shift of the phases in the first phase comparing unit K1a is a result at the present point. The detection result of the shift of the phases in the second phase comparing unit K1b is a result of the state of delay of the delay time (the minimum delay time) equivalent to one delay unit. Therefore, even if a relation of delay and advance of the phases of the reference clock and the comparison clock reverses, the detection results of the first phase comparing unit K1a and the second phase comparing unit K1b do not immediately coincide with each other. The detection result of the second phase comparing unit K1b is delayed by time equivalent to one delay unit.

Therefore, at a stage when the shift of the phases of the reference clock and the comparison clock changes from delay to advance or from advance to delay, an output from the AND unit AND1 is fixed to the "L" level within the delay time equivalent to one delay unit. Therefore, for example, it is possible to suppress a resonant phenomenon in which the phase of the reference clock and the phase of the comparison clock alternately repeat delay and advance.

In the configuration example of the phase detector K1 shown in FIG. 1, the detection of the shift of the phases in the second phase comparing unit K1b is delayed by the time equivalent to one delay unit with respect to the detection of the shift of the phases in the first phase comparing unit K1b. However, the same effect can be obtained when the detection of the shift of the phases in the second phase comparing unit K1b is advanced by time equivalent to one delay unit with respect to the detection of the shift of the phases in the first phase comparing unit K1a.

In this case, it is sufficient to set both the delay units 1 and 2 of the first phase comparing unit K1a to delay on, set the delay unit 3 of the second phase comparing unit K1b to delay off, and set the delay unit 4 to delay on.

Phase Comparator

The phase detector shown in FIG. 1 can be used as a phase comparator by applying the phase detector to a delay-phase detecting unit that detects delay of phases of the reference clock and the comparison clock and an advance-phase detecting unit that detects advance of the phases.

Figure 2:
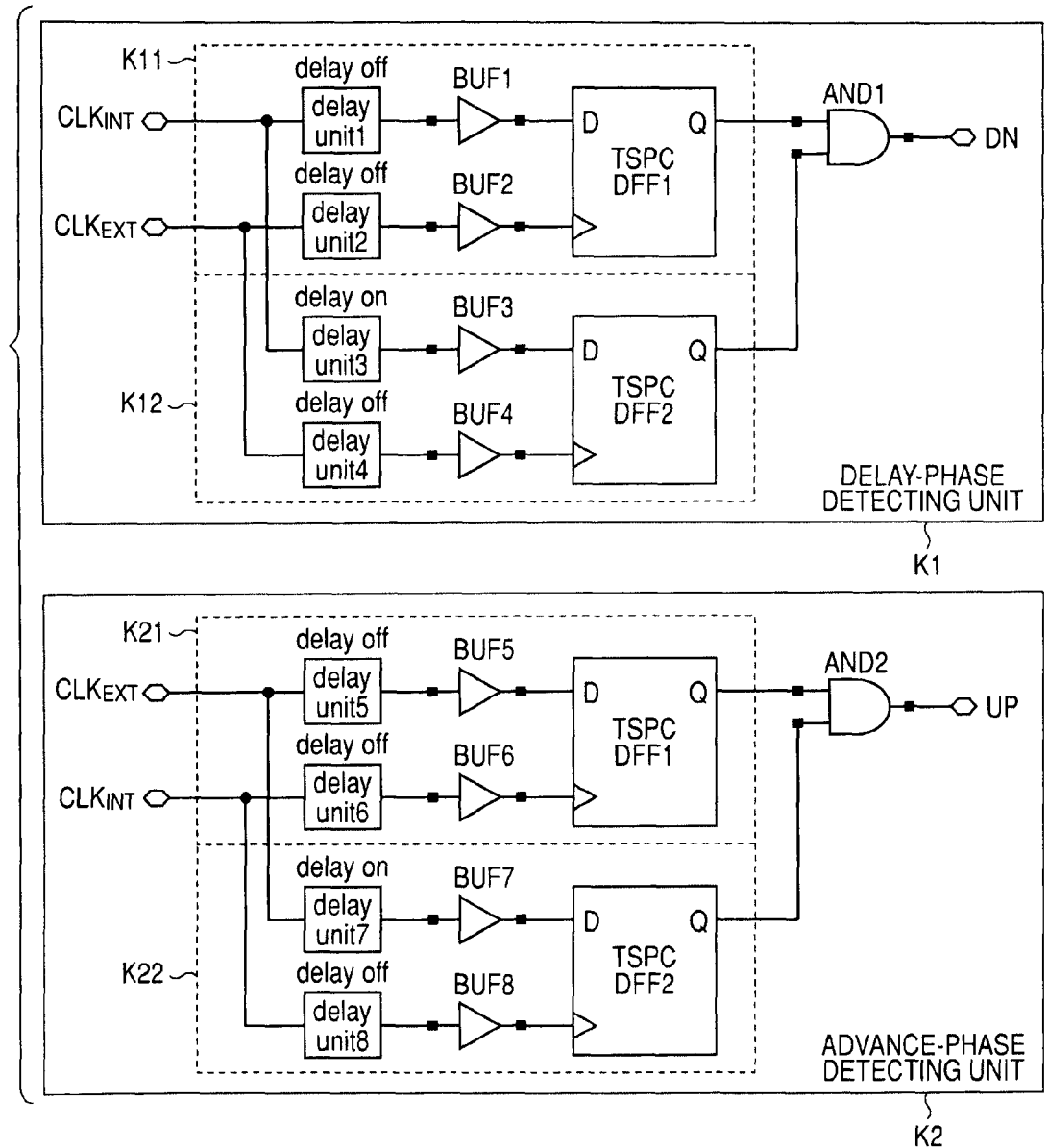
FIG. 2 is a circuit diagram for explaining a configuration example (1) of a phase comparator employing the phase detector according to the embodiment.

FIG. 2 is a circuit diagram for explaining a configuration example (1) of a phase comparator employing the phase detector according to this embodiment. This phase comparator makes it possible to surely find a lock point by using the flip-flop circuit (the TSPC-type DFF) according to this embodiment, which has the high speed and the narrow dead zone, and adding means for simultaneously monitoring a phase relation in a present state and a phase relation in a state in which a counter is advanced or delayed 1 bit.

The phase comparator includes a delay-phase detecting unit K1 and an advance-phase detecting unit K2. In the phase detecting units K1 and K2, the external clock CLKEXT and the internal clock CLKINT are connected to opposite connection destinations.

The delay-phase detecting unit K1 includes a present-phase-relation comparing unit K11, a phase-relation-after-one-count-down comparing unit K12, and the AND unit AND1. The advance-phase detecting unit K2 includes a present-phase-relation comparing unit K21, a phase-relation-after-one-count-up comparing unit K22, and the AND unit AND2.

The present-phase-relation comparing unit K11 includes the TSPCDFF 1 as the TSPC-type DFF, which is the flip-flop circuit according to this embodiment. Further, present-phase-relation comparing unit K11 includes the buffers BUF1 and BUF2 and the delay units 1 and 2 like the delay unit shown in FIG. 8.

In the present-phase-relation comparing unit K11, the internal clock CLKINT is input from the delay unit 1 to the data signal D of the TSPCDFF 1 via the buffer BUF1. The external clock CLKEXT is input from the delay unit 2 to a clock signal of the TSPCDFF 1 via the buffer BUF2. The data output Q of the TSPCDFF 1 is connected to one input of the AND unit AND1.

The phase-relation-after-one-count-down comparing unit K12 also includes the TSPCDFF 2 as the TSPC-type DFF, which is the flip-flop circuit according to this embodiment. Further, the phase-relation-after-one-count-down comparing unit K12 includes the buffers BUF3 and BUF4 and the delay units 3 and 4 like the delay unit shown in FIG. 8.

The phase-relation-after-one-count-down comparing unit K12 has a circuit configuration basically the same as that of the present-phase-relation comparing unit K11. In the phase-relation-after-one-count-down comparing unit K12, the internal clock CLKINT is input from the delay unit 3 to a data signal D of the TSPCDFF 2 via the buffer BUF3, the external clock CLKEXT is input from the delay unit 4 to a clock signal of the TSPCDFF 2 via the buffer BUF4, and the data output Q of the TSPCDFF 2 is connected to one input of the AND unit AND1. However, the phase-relation-after-one-count-down comparing unit K12 is different from the present-phase-relation comparing unit K11 in that the delay unit 3 in a line connected to the data signal D of the TSPCDFF 2 is in the state of delay on.

The present-phase-relation comparing unit K21 includes the TSPCDFF 1 as the TSPC-type DFF, which is the flip-flop circuit according to this embodiment. Further, the present-phase-relation comparing unit K21 includes buffers BUF5 and BUF6 and delay units 5 and 6 like the delay unit shown in FIG. 8.

In present-phase-relation comparing unit K21, the external clock CLKEXT is input from the delay unit 5 to the data signal D of the TSPCDFF 1 via the buffer BUF5. The internal clock CLKINT is input from the delay unit 6 to the clock signal of the TSPCDFF 1 via the buffer BUF6. The data output Q of the TSPCDFF 1 is connected to one input of the AND unit AND2.

The phase-relation-after-one-count-up comparing unit K22 also includes the TSPCDFF 2 as the TSPC-type DFF, which is the flip-flop circuit according to this embodiment. Further, the phase-relation-after-one-count-up comparing unit K22 includes buffers BUF7 and BUF8 and delay units 7 and 8 like the delay unit shown in FIG. 8.

The phase-relation-after-one-count-up comparing unit K22 has a circuit configuration basically the same as that of the present-phase-relation comparing unit K21. The external clock CLKEXT is input from the delay unit 7 to the data signal D of the TSPCDFF 2 via the buffer BUF7. The internal clock CLKINT is input from the delay unit 8 to the clock signal of the TSPCDFF 2 via the buffer BUF8. The data output Q of the TSPCDFF 2 is connected to one input of the AND unit AND2. However, the phase-relation-after-one-count-up comparing unit K22 is different from the present-phase-relation comparing unit K21 in that the delay unit 7 in a line connected to a data input side of the TSPCDFF 2 is in the state of delay on.

The state of delay on indicates a state in which the signal n bit shown in FIG. 8 is at the "H" level and the capacitors are connected to the delay line. In the delay-phase detecting unit K1, the phase-relation-after-one-count-down comparing unit K12 performs phase comparison in a state of delay by a minimum unit, in which the internal clock CLKINT can be adjusted in the delay line, with respect to the present-phase-relation comparing unit K11. In the advance-phase detecting unit K2, the phase-relation-after-one-count-up comparing unit K22 performs phase comparison in a state of delay by a minimum unit, in which the external clock CLKEXT can be adjusted in the delay line, with respect to the present-phase-relation comparing unit K11.

Therefore, the phase relation in the present state and the phase relation in the state in which the counter is delayed by 1 bit are simultaneously monitored. When a phase is inverted in the state in which the counter is delayed by 1 bit, i.e., when an output of the phase-relation-after-one-count-down comparing unit K12 changes to the "L" level, the count-down signal DN can be changed to the "L" level by the AND unit AND1 to stop a counter operation. When an output of the phase-relation-after-one-count-up comparing unit K22 changes to the "L" level, the count-up signal UP can be changed to the "L" level by the AND unit AND2 to stop the counter operation.

Consequently, in the case of the delay phase, it is possible to surely lock a phase with a phase shift within the delay time of the minimum unit that can be adjusted in the delay line.

On the other hand, in the advance-phase detecting unit K2, the phase-relation-after-one-count-up comparing unit K22 performs phase comparison in a state of delay by a minimum unit, in which the external clock CLKEXT can be adjusted in the delay line, with respect to the present-phase-relation comparing unit K21.

Therefore, the phase relation in the present state and the phase relation in the state in which the counter is advanced by 1 bit are simultaneously monitored. When a phase is inverted in the state in which the counter is advanced by 1 bit from the present state, i.e., when an output of the phase-relation-after-one-count-up comparing unit K22 changes to the "L" level, the count-up signal UP can be changed to the "L" level by the AND unit AND2 to stop a counter operation.

Consequently, in the case of the advance phase, as in the case of the delay phase, it is possible to surely lock a phase with a phase shift within the delay time of the minimum unit that can be adjusted in the delay line.

Figure 3:
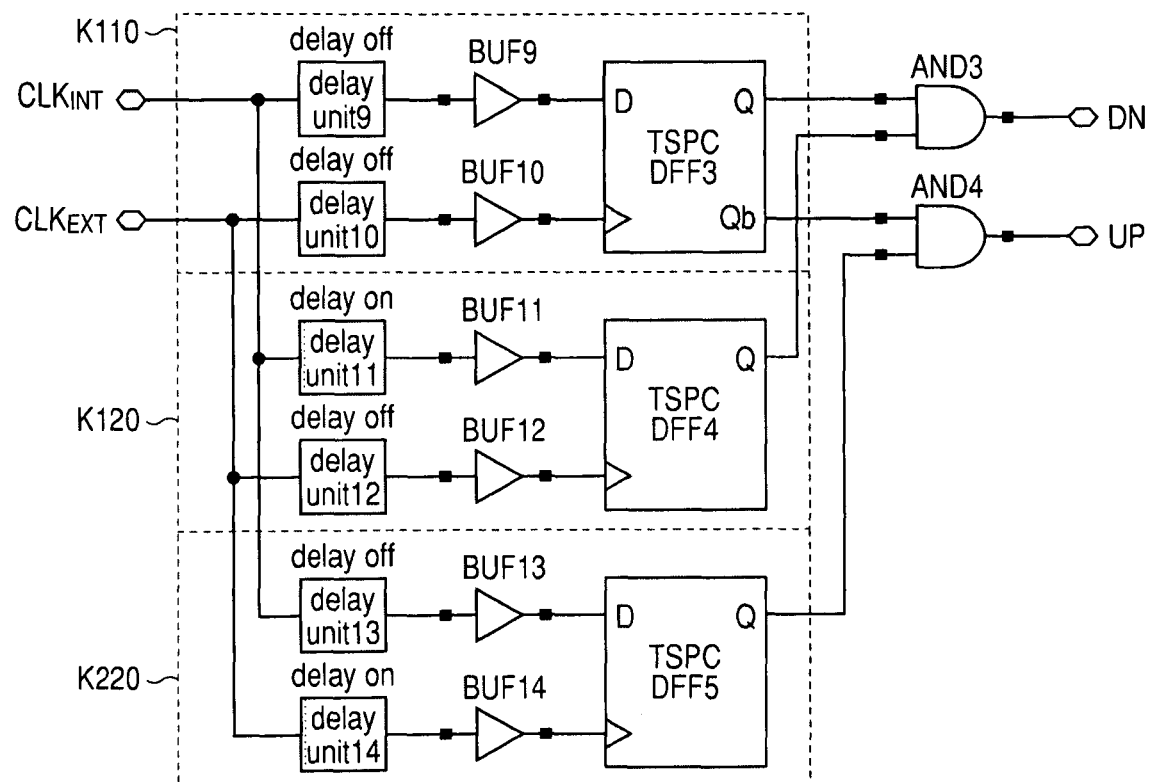
FIG. 3 is a circuit diagram for explaining a configuration example (2) of the phase comparator employing the phase detector according to the embodiment.

FIG. 3 is a circuit diagram of a configuration example (2) of the phase comparator employing the phase detector according to this embodiment. Like the phase comparator shown in FIG. 13, this phase comparator includes plural phase comparing units including DFFs, buffers, and delay units. Further, the phase comparator includes a present-phase-relation comparing unit K110, a phase-relation-after-one-count-down comparing unit K120, and a phase-relation-after-one-count-up comparing unit K220. In other words, the present-phase-relation comparing unit K11 of the delay-phase detecting unit K1 and the present-phase-relation comparing unit K21 of the advance-phase detecting unit K2 in the phase comparator shown in FIG. 2 are combined into one present-phase-relation comparing unit K110.

The phase comparator shown in FIG. 3 is different from the phase comparator shown in FIG. 2 in that a delay unit 14 on a clock input line is set in a state of delay on in the phase-relation-after-one-count-up comparing unit K220 and a count-up signal UP is generated by the AND unit AND4 by using an inverse phase output Qb of a TSPCDFF 3 of the present-phase-relation comparing unit K110 and an output Q of the phase-relation-after-one-count-up comparing unit K220.

Specifically, the present-phase-relation comparing unit K110 includes the TSPCDFF 3 as the TSPC-type DFF, which is the flip-flop circuit according to this embodiment. Further, the present-phase-relation comparing unit K110 includes buffers BUF9 and BUF10 and delay units 9 and 10 like the delay unit shown in FIG. 8.

In the present-phase-relation comparing unit K10, the internal clock CLKINT is input from the delay unit 9 to a data signal D of the TSPCDFF 3 via the buffer BUF9. The external clock CLKEXT is input from the delay unit 10 to a clock signal of the TSPCDFF 3 via the buffer BUF10. The data output Q of the TSPCDFF 3 is connected to one input of the AND unit AND3. The inverse phase output Qb of the TSPCDFF 3 is connected to one input of the AND unit AND4.

The phase-relation-after-one-count-down comparing unit K120 also includes a TSPCDFF 4 as the TSPC-type DFF, which is the flip-flop circuit according to this embodiment. Further, the phase-relation-after-one-count-down comparing unit K120 includes buffers BUF11 and BUF12 and delay units 11 and 12 like the delay unit shown in FIG. 8.

The phase-relation-after-one-count-down comparing unit K120 has a circuit configuration basically the same as that of the present-phase-relation comparing unit K110. In the phase-relation-after-one-count-down comparing unit K120, the internal clock CLKINT is input from the delay unit 11 to a data signal D of the TSPCDFF 4 via the buffer BUF11, the external clock CLKEXT is input from the delay unit 12 to a clock signal of the TSPCDFF 4 via the buffer BUF12, and a data output Q of the TSPCDFF 4 is connected to one input of the AND unit AND3. However, the phase-relation-after-one-count-down comparing unit K120 is different from the present-phase-relation comparing unit K110 in that the delay unit 11 in a line connected to the data signal D of the TSPCDFF 4 is in the state of delay on.

The phase-relation-after-one-count-up comparing unit K220 also includes the TSPCDFF 2 as the TSPC-type DFF, which is the flip-flop circuit according to this embodiment. Further, the phase-relation-after-one-count-up comparing unit K220 includes buffers BUF13 and BUF14 and delay units 13 and 14 like the delay unit shown in FIG. 8.

The phase-relation-after-one-count-up comparing unit K220 has a circuit configuration basically the same as that of the present-phase-relation comparing unit K110. The internal clock CLKINT is input from the delay unit 13 to a data signal D of the TSPCDFF 5 via the buffer BUF13. The external clock CLKEXT is input from the delay unit 14 to a clock signal of the TSPCDFF 5 via the buffer BUF14. The data output Q of the TSPCDFF 4 is connected to one input of the AND unit AND4. However, the phase-relation-after-one-count-up comparing unit K220 is different from the present-phase-relation comparing unit K110 in that the delay unit 14 in a line connected to a clock input side of the TSPCDFF 5 is in the state of delay on.

The state of delay on indicates a state in which the signal n bit shown in FIG. 8 is at the "H" level and the capacitors are connected to the delay line. The phase-relation-after-one-count-down comparing unit K120 performs phase comparison in a state of delay by a minimum unit, in which the internal clock CLKINT can be adjusted in the delay line, with respect to the present-phase-relation comparing unit K110. The phase-relation-after-one-count-up comparing unit K220 performs phase comparison in a state of delay by a minimum unit, in which the external clock CLKEXT can be adjusted in the delay line, with respect to the present-phase-relation comparing unit K110.

Therefore, the phase relation in the present state and the phase relation in the state in which the counter is delayed by 1 bit are simultaneously monitored. When a phase is inverted in the state in which the counter is delayed by 1 bit, i.e., when an output of the phase-relation-after-one-count-down comparing unit K120 changes to the "L" level, the count-down signal DN can be changed to the "L" level by the AND unit AND3 to stop a counter operation. When an output of the phase-relation-after-one-count-up comparing unit K220 changes to the "L" level, the count-up signal UP can be changed to the "L" level by the AND unit AND4 to stop the counter operation.

By adopting a configuration like that of the phase comparator shown in FIG. 3, it is possible to reduce a circuit size to two third while maintaining an effect same as that of the phase comparator shown in FIG. 2.

In the configuration examples of the phase detector shown in FIGS. 2 and 3, the detection of the shift of the phases in the phase-relation-after-one-count-down comparing unit K120 and the phase-relation-after-one-count-up comparing unit K220 is delayed by time equivalent to one delay unit with respect to the detection of the shift of the phases in the present-phase-relation comparing units K110 and K210. However, it is possible to obtain the same effect in a configuration in which the detection is advanced by time equivalent to one delay unit to the contrary. In this case, states of delay off and delay on of the delay units used in the phase-relation comparing unit only has to be reversed. DLL The phase comparator according to this embodiment is applied as the phase comparator 1 in the DLL of the digital system shown in FIG. 8. The DLL includes the phase comparator 1 that compares a phase difference between the external clock CLKEXT and the internal clock CLKINT, the counter 22 that controls a delay time according to the output signals UP and DN from the phase comparator 1, and the delay line 3 and the clock driver 4 that performs adjustment of the delay time.

The delay line includes the delay unit including the inverters INV1, INV2, and INV3, the switches SW1 and SW2, and the capacitors C1 and C2 shown in FIG. 9. Adjustment of a delay amount is realized by switching connection and disconnection of the capacitors C1 and C2 to and from the delay line according to a level of an output signal n bit from the counter 2 shown in FIG. 8.

In the DLL, when the internal clock CLKINT is delayed from the external clock CLKEXT, the signal DN is at an "H" level, the counter 2 counts down, the capacitors for delay adjustment (the capacitors C1 and C2 shown in FIG. 9) are disconnected from the delay line one after the other, and the phase difference between the external clock CLKEXT and the internal clock CLKINT is narrowed.

Conversely, when the internal clock CLKINT overtakes the external clock CLKEXT, the signal UP is at the "H" level, the counter 2 counts up, the capacitors for delay adjustment (the capacitors C1 and C2 shown in FIG. 9) are connected to the delay line one after the other, and the phase difference between the external clock CLKEXT and the internal clock CLKINT is narrowed.

As shown in FIG. 11, when the phase comparator used for the DLL is configured by a DFF, the internal clock CLKINT is connected to the data input unit (the data signal D) and the external clock CLKEXT is connected to the clock input unit. The signal UP is connected to the positive phase output Q and the signal DN is connected to the negative phase output Qb.

When the phase comparator according to this embodiment is used as the phase comparator 1 of the DLL, at a stage when a shift of phases changes from delay to advance or from advance to delay, a phase shift can be fixed in a state within a minimum delay time of the delay elements configuring the delay line 3. Therefore, for example, it is possible to suppress a resonant phenomenon in which the signals UP and DN are alternately output from the phase comparator 1.

Display Device

Figure 7:
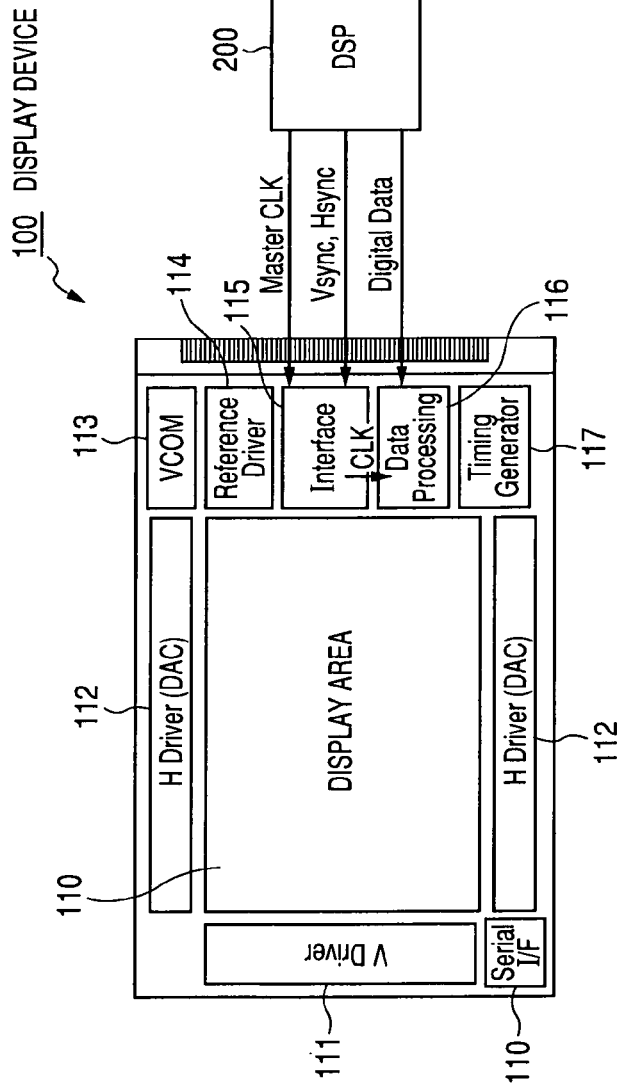
FIG. 7 is a block diagram of an example in which the phase comparator according to the embodiment is applied to a display device.

FIG. 7 is a block diagram of an example in which the phase comparator according to this embodiment is applied to a display device. A display device 100 includes, around a display area 101 in which plural pixels are arrayed in, for example, a matrix shape, a vertical driver 111, a horizontal driver 112, a common electrode 113, a reference driver 114, an interface circuit 115, a data processing circuit 116, a timing generating circuit 117, and a serial interface circuit 118.

A master clock (master CLK), a vertical synchronization signal (Vsync), a horizontal synchronization signal (Hsync), and digital data (image data) are supplied to the display device 100 from an external digital signal processing circuit 200. The display device 100 drives the peripheral circuits on the basis of these signals to display an image in the display area 110.

The phase comparator according to this embodiment is incorporated in, for example, the interface circuit 115. The phase comparator corrects a phase shift between the master clock (master CLK) transmitted from the external digital signal processing circuit 200 and a clock generated in the inside of the display device 100. In other words, a phase shift occurs between the master clock (master CLK) and the internal clock because of a level shift or drive in the display device 100. This phase shift is compared by the phase comparator according to this embodiment and corrected by the DLL by using a result of the comparison. The corrected clock is input to the data processing circuit 116. Data sampling is performed with high accuracy.

Implementation Effects

According to this embodiment explained above, it is possible to realize implementation effects explained below.

(1) The TSPC-type DFF having high speed and a narrow dead zone is used as the phase comparator. The means for simultaneously monitoring a phase relation in the present state and a phase relation in a state in which a delay time phase of a minimum unit that can be adjusted in the delay line is advanced or delayed is added. This makes it possible to surely find a lock point.

(2) The phase comparator that detects a phase relation between two clock signals of a reference clock and a comparison clock separately includes the delay-phase detecting unit and the advance-phase detecting unit. The two phase detecting units include the TSPC-type DFFs, the buffers, and the delay units. When one phase detecting unit is the delay-phase detecting unit, the delay unit on the comparison clock side is set in a delay state. When one phase detecting unit is the advance-phase detecting unit, the delay unit on the reference clock side is set in the delay state. An AND operation of an output of the phase detecting unit and an output of the phase detecting unit that does not set the delay unit in the delay state is performed. This makes it possible to realize the functions explained above.

(3) The phase comparator detects a phase relation between two clock signals of a reference clock and a comparison clock includes three phase detecting units including the TSPC-type DFFs, the buffers, and the delay units. The first phase detecting unit does not set the delay units in the delay state. The second phase detecting unit sets the delay unit on the reference clock side in the delay state. The third phase detecting unit sets the delay unit on the comparison clock side in the delay state. An AND operation of a positive phase output of the first phase detecting unit and a positive phase output of the third phase detecting unit is performed. An AND operation of an inverse phase output and a positive phase output of the second phase detecting unit is performed. This makes it possible to realize the functions explained above while holding down a circuit size.

(4) In the flip-flop circuit, the sixth n-channel transistor N6 for pull-down is added to the internal node NC. A gate potential of the sixth n-channel transistor N6 and a gate potential of the second p-channel transistor P2 forming the first latch circuit L1 are controlled according to the rise delay clock signal CKd obtained by delaying the rise of the clock signal CK with the rise delay circuit DC. This makes it possible to prevent the internal node NC from changing to the floating level during an operation period and realize a high-speed operation and a narrow dead zone.

(5) In the flip-flop circuit, the latch circuit formed by the clocked inverter circuit CINV including the inverter INV3, the fifth p-channel transistor P5, the sixth p-channel transistor P6, the seventh n-channel transistor N7, and the eighth n-channel transistor N8 is added to the internal node X. The control of a gate potential of the fifth p-channel transistor P5 is performed by the internal node NC rather than the clock signal CK. This makes it possible to prevent the internal node NC from floating during an operation period without disturbing a signal change of the internal node X and realize a stable operation without spoiling the high-speed characteristic.

It should be understood by those skilled in the art that various modifications, combinations, sub-combinations, and alterations may occur depending on design requirements and other factors insofar as they are within the scope of the appended claims or the equivalents thereof.

What is claimed is:

1. A flip-flop circuit comprising:
    a first latch circuit that receives input of a data signal and a rise delay clock signal obtained by delaying only rise of a clock signal, raises a signal of a first node according to the fall of the rise delay clock signal in a state in which the data signal falls, and lowers the signal of the first node according to rise of the rise delay clock signal;
    a second latch circuit that receives input of the signal of the first node and the clock signal and lowers a signal of a second node at timing when the clock signal falls in a state in which the signal of the first node rises;
    a third latch circuit that receives input of the signal of the second node and the clock signal and generates an output signal for maintaining the data signal in a state in which the clock signal rises;
    a pull-down circuit that pulls down the signal of the first node with the rise delay clock signal; and
    a clocked inverter circuit that is connected to the second node, and that receives the signal of the first node and the clock signal as input such that floating of the second node is prevented by the signal of the first node at a rise of the clock signal,
    wherein the rise delay clock signal is input to the pull-down circuit, and floating of the first node is prevented by the rise delay clock signal at rise of the clock signal,
    wherein the clocked inverter circuit includes a fifth p-channel transistor, a sixth p-channel transistor, a seventh n-channel transistor, and an eighth n-channel transistor connected in series, and
    wherein the first node signal is input to a gate of the fifth p-channel transistor, the signal of the second node is input to gates of the sixth p-channel transistor and the seventh n-channel transistor via an inverter, and the clock signal is input to a gate of the eighth n-channel transistor.

2. A flip-flop circuit according to claim 1, wherein
    the first latch circuit includes a first p-channel transistor, a second p-channel transistor, and a first n-channel transistor connected in series,
    the data signal is input to gates of the first p-channel transistor and the first n-channel transistor, and
    the rise delay clock signal is input to a gate of the second p-channel transistor.

3. A flip-flop circuit according to claim 1, wherein
the second latch circuit includes a third p-channel transistor, a second n-channel transistor, and a third n-channel transistor connected in series,
the clock signal is input to gates of the third p-channel transistor and the third n-channel transistor, and
the signal of the first node is input to a gate of the second n-channel transistor gate.

4. A flip-flop circuit according to claim 1, wherein
the third latch circuit includes a fourth p-channel transistor, a fourth n-channel transistor, and a fifth n-channel transistor connected in series,
the signal of the second node is input to gates of the fourth p-channel transistor and the fifth n-channel transistor, and
the clock signal is input to a gate of the fourth n-channel transistor.

5. A flip-flop circuit according to claim 1, wherein
the pull-down circuit includes a sixth n-channel transistor,
the rise delay clock signal is input to a gate of the sixth n-channel transistor, and
the first node is connected to a source of the sixth n-channel transistor.

6. A phase comparator comprising the flip-flop circuit according to claim 1, and further comprising:
a delay-phase detecting unit that detects a delay of a phase of a comparison clock with respect to a phase of a reference clock; and
an advance-phase detecting unit that detects advance of the phase of the comparison clock with respect to the phase of the reference clock, wherein
the delay-phase detecting unit includes:
a first phase comparing unit that detects the delay of the phase of the comparison clock with respect to the phase of the reference clock;
a second phase comparing unit that detects, concerning one of the reference clock and the comparison clock, a delay of a phase of the comparison clock with respect to a phase of the reference clock in a state of delay or advance by a predetermined time; and
a first AND unit that outputs, as a result of the detection of the phase delay, an AND of an output of the first phase comparing unit and an output of the second phase comparing unit, and
the advance-phase detecting unit includes:
a third phase comparing unit that detects advance of the phase of the comparison clock with respect to the phase of the reference clock;
a fourth phase comparing unit that detects, concerning one of the reference clock and the comparison clock, advance of the phase of the comparison clock with respect to the phase of the reference clock in the state of delay or advance by the predetermined time; and
a second AND unit that outputs, as a result of the detection of the phase advance, an AND of an output of the third phase comparing unit and an output of the fourth phase comparing unit.

7. A phase comparator comprising the flip-flop circuit according to claim 1, and further comprising:
a first phase comparing unit that detects a shift of a phase of the comparison clock with respect to a phase of a reference clock and outputs signals in opposite phases in phase delay and phase advance;
a second phase comparing unit that detects, concerning one of the reference clock and the comparison clock, delay of a phase of the comparison clock with respect to a phase of the reference clock in a state of delay or advance by a predetermined time;
a third phase comparing unit that detects, concerning one of the reference clock and the comparison clock, advance of the phase of the comparison clock with respect to the phase of the reference clock in the state of delay or advance by the predetermined time;
a first AND unit that outputs, as a result of the detection of the phase delay, an AND of an output of phase delay of the first phase comparing unit and an output of the second phase comparing unit; and
a second AND unit that outputs, as a result of the detection of the phase advance, an AND of an output of phase advance of the first phase comparing unit and an output of the third phase comparing unit.

8. The flip-flop circuit according to claim 1 and further comprising a clock synchronizing device that synchronizes a phase of a reference clock and a phase of a comparison clock, the clock synchronizing device comprising:
a phase comparator that detects delay and advance of the phase of the comparison clock with respect to the phase of the reference clock;
an up/down counter that outputs a count value on the basis of a detection result from the phase comparator; and
a delay line that adjusts an intervention amount of plural delay elements on the basis of the count value output from the up/down counter and adjusts a delay amount of delay elements of the comparison clock, wherein
the phase comparator includes:
a delay-phase detecting unit including:
a first phase comparison unit that detects delay of the phase of the comparison clock with respect to the phase of the reference clock;
a second phase comparison unit that detects, concerning one of the reference clock and the comparison clock, a delay of a phase of the comparison clock with respect to a phase of the reference clock in a state of delay or advance by a minimum delay time; and
a first AND unit that outputs, as a result of the detection of the phase delay, an AND of an output of the first phase comparing unit and an output of the second phase comparing unit; and
an advance-phase detecting unit including:
a third phase comparing unit that detects advance of the phase of the comparison clock with respect to the phase of the reference clock;
a fourth phase comparing unit that detects, concerning one of the reference clock and the comparison clock, advance of the phase of the comparison clock with respect to the phase of the reference clock in the state of delay or advance by the minimum delay time; and
a second AND unit that outputs, as a result of the detection of the phase advance, an AND of an output of the third phase comparing unit and an output of the fourth phase comparing unit.

9. The flip-flop circuit according to claim 1 and further comprising clock synchronizing device that synchronizes a phase of a reference clock and a phase of a comparison clock, the clock synchronizing device comprising:
a phase comparator that detects delay and advance of the phase of the comparison clock with respect to the phase of the reference clock;
an up/down counter that outputs a count value on the basis of a detection result from the phase comparator; and
a delay line that adjusts an intervention amount of plural delay elements on the basis of the count value output from the up/down counter and adjusts a delay amount of delay elements of the comparison clock, wherein the phase comparator includes:

a first phase comparing unit that detects a shift of the phase of the comparison clock with respect to the phase of the reference clock and outputs signals in opposite phases in phase delay and phase advance;

a second phase comparing unit that detects, concerning one of the reference clock and the comparison clock, delay of a phase of the comparison clock with respect to a phase of the reference clock in a state of delay or advance by a minimum delay time;

a third phase comparing unit that detects, concerning one of the reference clock and the comparison clock, advance of the phase of the comparison clock with respect to the phase of the reference clock in the state of delay or advance by the minimum delay time;

a first AND unit that outputs, as a result of the detection of the phase delay, an AND of an output of phase delay of the first phase comparing unit and an output of the second phase comparing unit; and a second AND unit that outputs, as a result of the detection of the phase advance, an AND of an output of phase advance of the first phase comparing unit and an output of the third phase comparing unit.

* * * * *